United States Patent [19]
Schrock et al.

[11] Patent Number: 6,110,805
[45] Date of Patent: Aug. 29, 2000

[54] METHOD AND APPARATUS FOR ATTACHING A WORKPIECE TO A WORKPIECE SUPPORT

[75] Inventors: Ed Schrock; Tongbi Jiang, both of Boise, Id.

[73] Assignee: Micron Technology, Inc., Boise, Id.

[21] Appl. No.: 08/994,460

[22] Filed: Dec. 19, 1997

[51] Int. Cl.[7] .................................................. C09J 5/06
[52] U.S. Cl. ........................ 438/455; 438/459; 156/321
[58] Field of Search .................................. 438/455, 459; 156/321, 306.6, 306.9

[56] References Cited

U.S. PATENT DOCUMENTS

| | | | |
|---|---|---|---|
| 4,998,665 | 3/1991 | Hayashi | 228/180.1 |
| 5,475,048 | 12/1995 | Jamison et al. | 524/439 |

OTHER PUBLICATIONS

Quantum Materials—QMI505 Process Data Sheet, Jun. 1997.
Quantum Materials—Cure Kinetics for QMI 505 Data Sheet, not dated.
Johnson Matthey—JMXICM37 and JM2000LB Data Sheet, Jun. 1996.
Ablestick—RP224–1 Snap Cure Profile Data Sheet, Sep. 1996.

*Primary Examiner*—Daniel Zirker

[57] ABSTRACT

A method for attaching a workpiece, for example a semiconductor die, to a workpiece holder, for example a lead frame die support, comprises the steps of interposing an uncured adhesive between the semiconductor die and the die support and preheating the adhesive from an ambient temperature to a preheat temperature of between about 150° C. and about 160° C. over a period of about 1.5 seconds. Next, the preheat temperature is maintained for about 1.5 seconds, then the adhesive is further heated to a temperature of between about 190° C. and about 200° C. over a period of about 1.0 second. The inventive method quickly cures the adhesive to secure the die to the support with acceptably low levels of voiding. An apparatus which can be adapted to perform the inventive method is further described.

19 Claims, 2 Drawing Sheets

METHOD AND APPARATUS FOR ATTACHING A WORKPIECE TO A WORKPIECE SUPPORT

FIELD OF THE INVENTION

This invention relates to the field of semiconductor fabrication, and more particularly to a method and apparatus for attaching a semiconductor wafer section such as a die to a wafer section support such as a lead frame.

BACKGROUND OF THE INVENTION

During the assembly of a multi-component semiconductor device, a semiconductor wafer section such as a die is typically attached to a wafer section support such as a lead frame, a ceramic support, or a printed circuit board. For example, a die attach adhesive such as a silver-filled epoxy paste is interposed between a die and a lead frame, then the lead frame is placed on a hot plate or another heat source for 2.5 hours or longer to cure the die attach adhesive. After this curing step the assembly is further processed, which includes attaching bond wires between the die and the lead frame, then encapsulating the die and a portion of the lead frame in plastic.

Increasing production output, which decreases the cost per device, is a continuing goal of process engineers. Adhesives which can be cured during the normal course of device assembly, or "in-line curable" adhesives, have been proposed. U.S. Pat. No. 5,475,048 by Jamison et al., issued Dec. 12, 1995 which is incorporated herein by reference in its entirety, describes a conductor-filled thermoset resin which can be cured in less than two minutes at a temperature of 200° C. or below. Other adhesives which have a rapid cure profile given adequate temperatures are available.

Equipment is also available which provides rapid curing of adhesives. For example, the Sync-Rite SC-3000 oven available from Phicom USA, Inc. of Cupertino, Calif. contains eight programmable stages and has a cycle time of more than 80 seconds for each lead frame. This is a considerable time improvement over prior curing methods which require up to 2.5 hours but adds to equipment costs, processing steps, and space requirements.

One problem that often occurs with rapid curing such as that desirable with in-line cure processes is voiding in the adhesive material which results from outgassing during the adhesive cure. Voids form in the adhesive material lying between the two surfaces being attached, for example between a die and a lead frame, which provides a poor attachment that can later fail during operation of the device.

Additionally, excessive stress can be introduced to the package during a rapid cure process due to the rapid attainment of elevated temperatures and subsequent return to ambient in combination with large differences in the coefficients of thermal expansion of the package components, which can result in an early failure of the package or the semiconductor die itself. The in-line oven cure solution described above can reduce problems such as voiding and stress but, again, requires additional space, adds processing steps, and increases equipment costs.

A method and structure for attaching a wafer section to a wafer section support which increases throughput would be desirable.

SUMMARY OF THE INVENTION

The present invention provides a new method and apparatus used during the formation of a semiconductor device which increases production throughput by reducing the time required by the die attach procedure. In accordance with one embodiment of the inventive method, a die attach material is preheated to a first temperature over a first timed period. This first temperature is generally maintained for a second timed period at least 80% of the first timed period. Next, the die attach material is heated to a second temperature greater than the first temperature for a third timed period at least half as long as the first timed period.

Using such a temperature profile, many resin-based die attach adhesives can be cured in a very short time, for example in about four seconds, with acceptable levels of voiding therein. In another inventive embodiment, the die attach adhesive is cured in-line at a wire bond step using a preheater.

An inventive apparatus for heating a workpiece such as a die-lead frame assembly having an uncured die attach adhesive interposed therebetween may comprise a plate having a nonplanar face with at least first and second surfaces and a heater for heating the plate to a generally uniform temperature. The apparatus further comprises a transporter which advances the workpiece over the face along a generally planar path which does not contact at least the first surface. A first distance between the path and the first surface is greater than a second distance between the path and the second surface.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
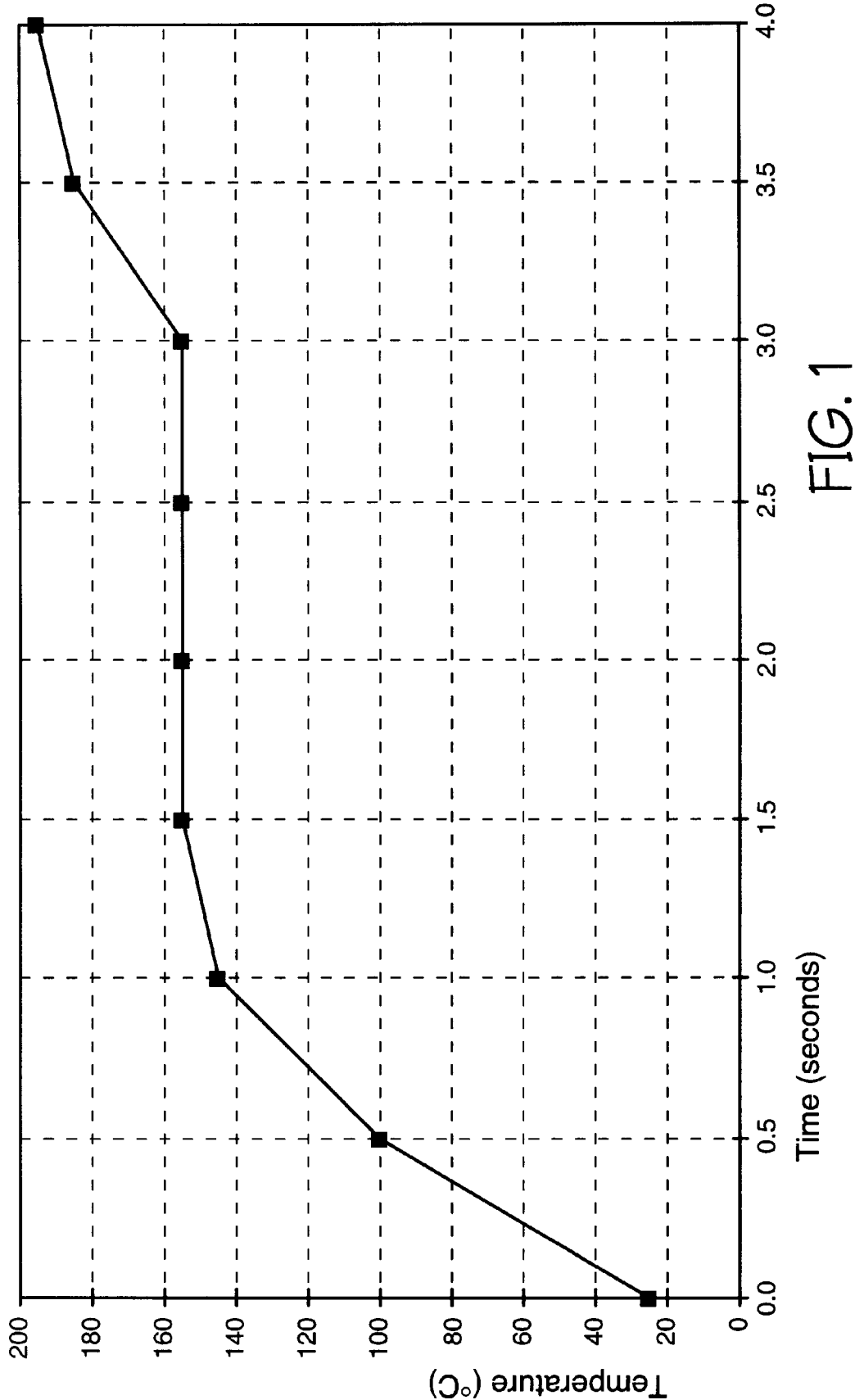
FIG. 1 is a graph generally depicting a temperature profile for adhesives such as die attach adhesives which provides a rapid cure with acceptable levels of voiding.

An embodiment of the instant invention provides a temperature profile for adhesives which results in a rapid cure of the adhesive while minimizing voiding. The profile is generally depicted in FIG. 1. The profile can be applied to the manufacture of a multi-component semiconductor device, and more specifically to attaching a semiconductor wafer section, such as a semiconductor die, to a wafer section support, such as a lead frame. The method can be performed during a wire bond procedure but can also be performed as a separate device assembly step.

Generally, one inventive embodiment includes interposing an uncured adhesive between a semiconductor wafer section and a wafer section support, preheating the adhesive from an ambient temperature to a preheat temperature of at least 150° C., for example about 155° C., over a period of about 1.5 seconds, and maintaining the preheat temperature for at least one second. A maximum desirable preheat temperature depends on the formulation of the die attach material, and more specifically on the solvent (diluent)

boiling temperature and percentage and on the type of catalyst and reaction mechanism of the resin. Finally, the adhesive is further heated to a second temperature greater than the preheat temperature of at least 190° C., for example 195° C., for a period of about one second or longer.

It should be noted that the temperatures described herein were measured by adhering a thermocouple to a die side of a conventional lead frame die paddle with 505 die attach adhesive available from Quantum Material, Inc. of San Diego, Calif. The lead frame having a die attached thereto with the 505 adhesive was processed at a wire bonder as described below and the temperatures were measured. Temperatures at various locations on the lead frame, at various locations on the die, and at various locations within the adhesive itself may vary slightly from the temperatures described herein, but it is believed the three components approach temperature equilibrium.

The temperature profile can be sufficiently performed during a wire bonding step. The preheating step can be performed using a wire bond preheater such as a model 2810 workholder available from Kulicke & Soffa Industries, Inc. (K&S) of Willow Grove, Pa. Setting the preheater in a noncontacting mode with an air gap of about 10 mils between the lead frame and the preheater would be sufficient. The temperature of the preheater can be set to about 375° C. up to about 400° C. which, using an alloy 42 and copper lead frame with various size semiconductor die, will provide a lead frame temperature of between about 140° C. and 160° C. in about two seconds. As it is the temperature of the lead frame which is critical, the temperature of the workholder can be adjusted away from the 375° C. to 400° C. range if required to provide a desired lead frame temperature.

Next, the lead frame is advanced to a bond site where the lead frame rests directly on the bond site heat block with no air gap between the lead frame and the bond site heat block. Setting the bond site heat block temperature in the range of about 200° C. to about 210° C. provides for a lead frame temperature of between about 190° C. and 200° C. in three to four seconds.

This process provides a two-stage cure profile. The first preheat stage gels the adhesive and the second stage crosslinks the adhesive.

For other wire bonders, the foregoing procedure may require some modification to provide the temperature profile shown in FIG. 1. For example, with the Kulicke & Soffa model 2920 workholder the frames contact the preheater due to the design of the preheater. In this particular case it is not necessary to significantly alter the preheater and bond site heat block temperatures from those described for the 2810. Additionally, the temperatures of the preheater and bond site heat block may need to be altered for different die sizes. Optimizing the temperatures for various assembly equipment and manufacturing designs can be accomplished by a process engineer of ordinary skill in the art with minimal experimentation.

Temperatures other than those shown in the profile of FIG. 1 may also be adequate for curing resin-based adhesives with acceptable levels of voiding, but the profile should be generally maintained. For example, a process which preheats the adhesive to a first temperature over a first timed period, generally maintains the first temperature for a second timed period which is at least 80% of the first timed period, then heats the adhesive to a second temperature greater than the first temperature, for example at least about 18% greater than the first temperature for a third period at least half as long as the first timed period may be sufficient for some resin-based adhesives. Preferably, the second timed period is about equal to the first timed period.

For bismalemide resin adhesives used to attach semiconductor die to lead frames it is believed the above-described process will result in an adhesive which is at least 80% cured as measured using differential scanning calorimetry (DSC). More typically, it is believed the process will result in an adhesive which about 90% cured after maintaining the first temperature for the second timed period and about 100% cured after the step of further heating the adhesive to the second temperature. For bismalemide resins the first temperature should be at least 120° C. This process can again be performed in-line, for example during a wire bond step, or as a separate step in the manufacturing process. Adhesives which remain less than 100% cured after wire bonding can be fully cured subsequently during a separate additional cure step, although full curing will typically occur in-line during later manufacturing steps such as encapsulation. If the profile is applied to an adhesive during an in-line process, for example before or during wire bonding, it is evident the adhesive should be sufficiently cured before or during the step so that the step itself is not negatively affected by insufficiently-cured adhesive. Depending on the process, this may be less than the 80% cure described above.

Several die attach adhesives can be adequately cured using the profile of FIG. 1. For example, the QMI 505 adhesive described above and SLT-05P™ available from Zymet of East Hanover, N.J. can be sufficiently cured by heating the adhesives according to the profile of FIG. 1.

Thus an inventive embodiment for forming a semiconductor device comprises the steps of interposing an uncured adhesive between a semiconductor wafer section and a wafer section support, then preheating the adhesive from an ambient temperature to a preheat temperature of between about 150° C. and about 160° C. over a period of about 1.5 seconds. This preheat temperature is maintained for about 1.5 seconds then the adhesive is further heated to a temperature of between about 190° C. and about 200° C. over a period of at least about 1.0 second. The step of further heating can comprise the use of a wire bond apparatus, for example while the wafer section support is wire bonded to the wafer section.

In another embodiment, a die attach is cured using the profile of FIG. 1 wherein the temperature is within ±5° C. of that shown, and the time is within ±10%, and preferably within ±5%, of that shown. Depending on the use of the adhesive and the adhesive used, a profile having a temperature within ±20° C. and a time within ±50% of that shown in FIG. 1 may be adequate.

Figure 2:
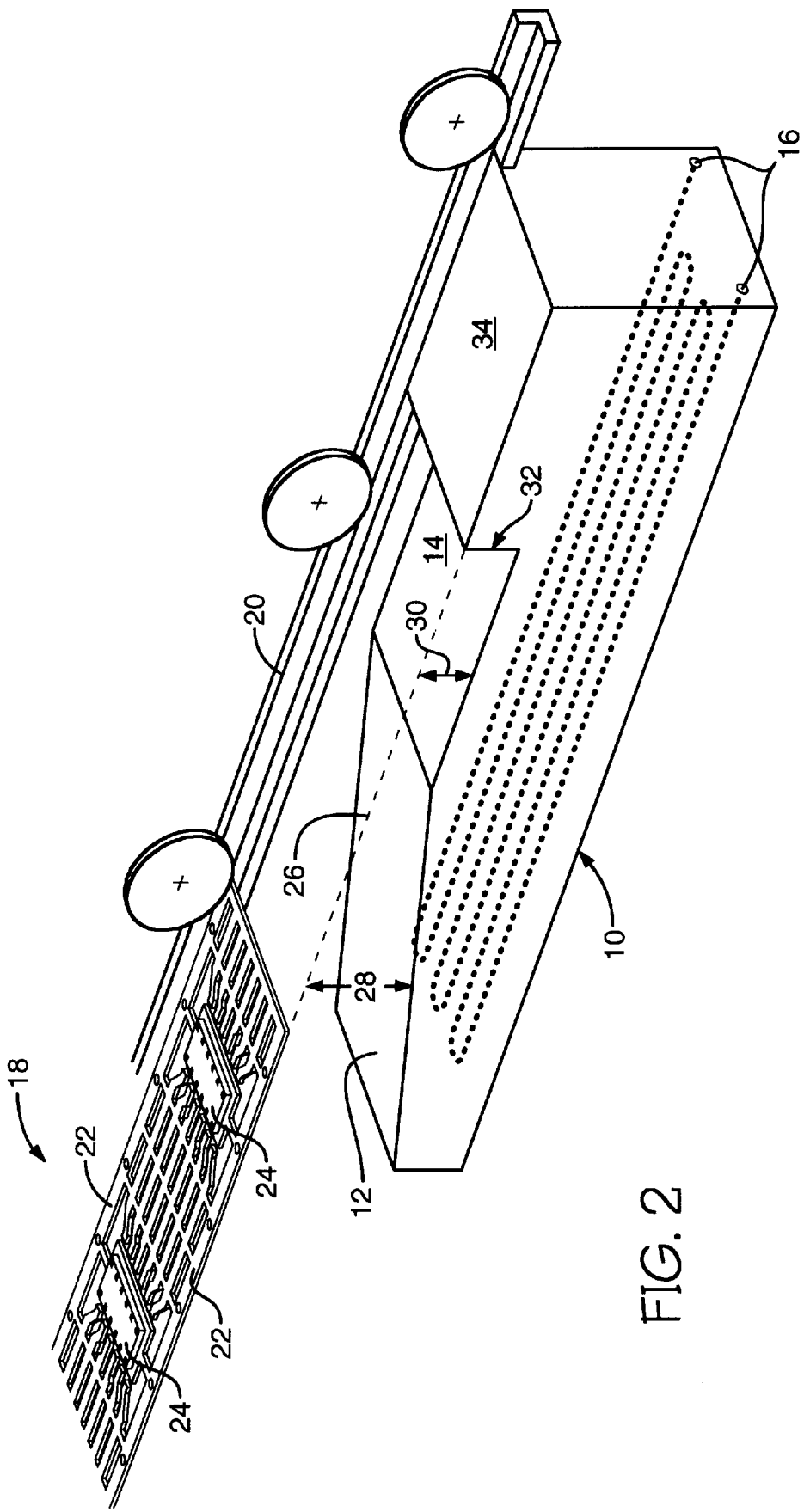
FIG. 2 is an isometric depiction of an inventive plate which can be adapted to produce the profile of FIG. 1.

FIG. 2 is an isometric view depicting an apparatus which can be adapted to practice the inventive method. As depicted in FIG. 2 the apparatus comprises a plate 10, for example a heat block, having a nonplanar face (at least first 12 and second 14 surfaces). A heater, for example one or more channels 16 as depicted containing a heated liquid such as water or oil, an electrical coil, or some other heater heats the plate to a generally uniform temperature. A transporter 20, such as the K&S model 2810 workholder described above partially depicted in FIG. 2, a model 2920 also available from K&S, or another transporter advances the workpiece 18, for example the lead frame 22 having die 24 thereupon depicted, over the face along a generally planar path 26 which does not contact the first surface 12. As depicted, a first distance 28 between the path 26 and the first surface 12 is different (in this embodiment greater) than a second distance 30 between the path 26 and the second surface 14. The apparatus depicted in FIG. 2 can comprise a part of a wire bonder or another piece of manufacturing equipment, or can be a stand-alone unit.

FIG. 2 further depicts third 32 and fourth 34 surfaces. In one embodiment, the fourth surface is a wire bond site and contact is made between the fourth surface and the workpiece. As can be seen, the first surface 12 intersects the second 14 surface at an oblique angle. The third 32 surface intersects both the second 14 and fourth 34 surfaces at right angles. The apparatus of FIG. 2 at a given temperature of the plate and speed of the transporter would produce a temperature profile similar to that depicted in FIG. 1. As the lead frame advances over the first surface, the distance between the lead frame and the first surface gradually decreases, which results in a temperature ramp of the lead frame. The distance between the lead frame and the face remains constant as the lead frame advances over the second surface which is parallel with the path of the lead frame. As the lead frame advances from over the second surface to contact the fourth surface (the wire bond site) the temperature further increases.

In another embodiment, the surfaces can be heated separately such that two or more of the surfaces are maintained at different temperatures for improved temperature control.

In another embodiment, an apparatus can be used which has a single temperature-controlled face which can be quickly heated and cooled. In this embodiment, the workpiece would not be transported as it is heated according to a preselected profile, but the temperature profile of the workpiece would approximate the varying temperature of the face.

To more accurately control the temperature of the lead frame, the lead frame can be interposed between the plate and a hot and/or cold air source. The temperature, flow rate, and diffusion of the air emitted from the air source as it blows on the lead frame or other workpiece aids in the heating, cooling, and temperature uniformity of the lead frame temperature.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example the wafer section can comprise a semiconductor die, two or more unsingularized semiconductor die, or a complete wafer. The wafer section support can comprise a lead frame, a ceramic substrate assembly, a support for an intact wafer, a printed circuit board, or various other carriers or assemblies. It is therefore contemplated that the appended claims will cover any such modifications or embodiments as fall within the true scope of the invention.

What is claimed is:

1. A method for forming a semiconductor device comprising the following steps:
    interposing an uncured adhesive between a semiconductor wafer section and a wafer section support;
    preheating said adhesive from an ambient temperature to a preheat temperature of at least 150° C. over a period of about 1.5 seconds;
    maintaining said preheat temperature for at least about 1.0 second; and
    further heating said adhesive to a second temperature greater than said preheat temperature of at least 190° C. over a period of at least about 1.0 second.

2. The method of claim 1 wherein said preheat temperature is about 155° C.

3. The method of claim 2 wherein said step of further heating increases said temperature of said adhesive to about 195° C.

4. The method of claim 1 further comprising the step of effecting a wire bond between said wafer section and said lead frame during said step of further heating said adhesive.

5. The method of claim 1 wherein said step of preheating is effected with a wire bonder preheater, and said step of further heating said adhesive is performed on a wire bond apparatus.

6. A method for forming a semiconductor device comprising the following steps:
    interposing an uncured adhesive between a semiconductor wafer section and a wafer section support;
    preheating said adhesive from an ambient temperature to a preheat temperature of between about 150° C. and about 160° C. over a period of about 1.5 seconds;
    maintaining said preheat temperature for about 1.5 seconds; and
    further heating said adhesive to a temperature of between about 190° C. and about 200° C. over a period of at least about 1.0 second.

7. The method of claim 6 wherein said wafer section is a semiconductor die, and said step of further heating said adhesive is effected by a wire bond apparatus, and wherein said semiconductor wafer support is wire bonded to said die during said step of further heating said adhesive.

8. A method used during the formation of a semiconductor device comprising the following steps:
    providing a semiconductor wafer section, a wafer section support, and a die attach material interposed between said wafer section and said support;
    preheating said die attach material to a first temperature over a first period of time;
    generally maintaining said first temperature of said die attach material for a second period of time which is at least 80% of said first period of time; and
    further heating said die attach material to a second temperature greater than said first temperature for a third period of time at least half as long as said first period.

9. The method of claim 8 wherein said step of further heating said die attach material comprises the step of increasing said temperature of said die attach material by at least about 18% to reach said second temperature.

10. The method of claim 8 further comprising the step of curing said adhesive at least 80% during said step of generally maintaining said first temperature of said adhesive.

11. The method of claim 8 further comprising the step of curing said adhesive about 90% during said step of generally maintaining said first temperature of said adhesive and curing said adhesive about 100% during said step of further heating said die attach material to said second temperature.

12. The method of claim 8 wherein said steps of preheating and further heating are effected by a wire bond apparatus.

13. The method of claim 8 wherein said second period of time is about equal to said first period of time.

14. A method used during the formation of a semiconductor device comprising the following steps:
    providing a semiconductor wafer section and a wafer section support;
    providing a die attach adhesive interposed between said wafer section and said support;
    heating said die attach adhesive using a temperature and time profile generally defined by the following graph:

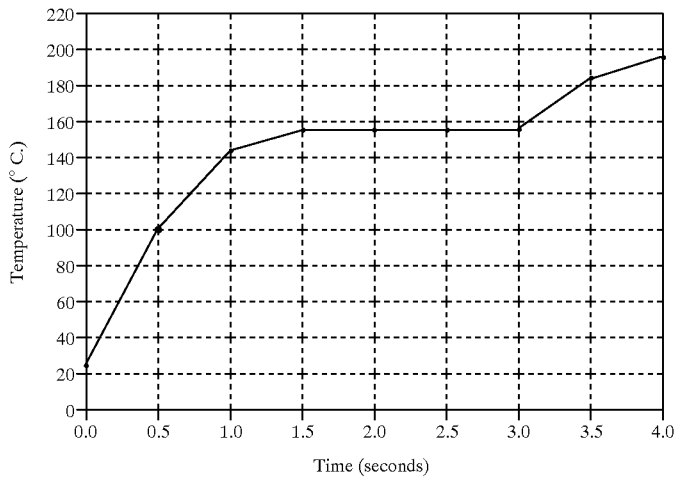

wherein said temperature is within ±120° C. and said time is within ±50% of that depicted.

15. The method of claim 14 wherein said step of heating of said die attach material is performed during a wire bond procedure.

16. The method of claim 14 wherein said temperature is within ±5° C. of that depicted and said time is within ±10% of that depicted.

17. A method for forming a semiconductor device comprising the following steps:

providing a semiconductor wafer section, a wafer section support, and a die attach adhesive interposed between said wafer section and said support, thereby forming a workpiece;

providing a plate having at least first and second surfaces, said first surface being noncoplanar with said second surface;

heating said first and second surfaces to a generally uniform temperature;

advancing said workpiece over said first surface to heat said workpiece to a first temperature, wherein said workpiece is a first distance from said first surface as it advances over said first surface;

advancing said workpiece over said second surface to heat said workpiece to a second temperature different from said first temperature, wherein said workpiece is a second distance from said second surface as it advances over said second surface, wherein said second distance is different from said first distance.

18. The method of claim 17 wherein said step of providing said plate includes providing a part of a wire bond apparatus.

19. The method of claim 17 wherein during said step of providing said plate, said first surface is parallel with said second surface.

* * * * *

UNITED STATES PATENT AND TRADEMARK OFFICE
CERTIFICATE OF CORRECTION

PATENT NO. : 6,110,805
DATED : August 29, 2000
INVENTOR(S) : Schrock et al.

It is certified that error appears in the above-identified patent and that said Letters Patent is hereby corrected as shown below:

<u>Column 7,</u>
Line 22, after "temperature is within" please replace "±120" with -- ±20 --.

Signed and Sealed this

Nineteenth Day of March, 2002

Attest:

JAMES E. ROGAN
*Attesting Officer*     *Director of the United States Patent and Trademark Office*